United States Patent
Lei et al.

(10) Patent No.: US 10,763,103 B2
(45) Date of Patent: Sep. 1, 2020

(54) BORON-CONTAINING COMPOUNDS, COMPOSITIONS, AND METHODS FOR THE DEPOSITION OF A BORON CONTAINING FILMS

(71) Applicant: Versum Materials US, LLC, Tempe, AZ (US)

(72) Inventors: Xinjian Lei, Vista, CA (US); Moo-Sung Kim, Gyunggi-do (KR)

(73) Assignee: Versum Materials US, LLC, Tempe, AZ (US)

( * ) Notice: Subject to any disclaimer, the term of this patent is extended or adjusted under 35 U.S.C. 154(b) by 0 days.

(21) Appl. No.: 15/079,585

(22) Filed: Mar. 24, 2016

(65) Prior Publication Data

US 2016/0293410 A1    Oct. 6, 2016

Related U.S. Application Data

(60) Provisional application No. 62/140,570, filed on Mar. 31, 2015.

(51) Int. Cl.
*H01L 21/02* (2006.01)
*C07F 5/02* (2006.01)
(Continued)

(52) U.S. Cl.
CPC ........ *H01L 21/02205* (2013.01); *C07F 5/022* (2013.01); *C07F 5/027* (2013.01);
(Continued)

(58) Field of Classification Search
CPC .. C07F 5/022; C07F 5/027; C07F 5/05; C23C 16/34; C23C 16/342; C23C 16/345;
(Continued)

(56) References Cited

U.S. PATENT DOCUMENTS 3,031,503 A    4/1962  Runkle
4,312,989 A *  1/1982  Spielvogel ............. C07F 5/027
                                                        546/13

(Continued)

FOREIGN PATENT DOCUMENTS

WO    2014009169    1/2014

OTHER PUBLICATIONS

Burg, A. B. et al, "Silyl-Amino Boron Compounds", J. Am. Chem. Soc., 1950, 72: 3103-3107.

(Continued)

*Primary Examiner* — Mohammed Shamsuzzaman
(74) *Attorney, Agent, or Firm* — David K. Benson

(57) ABSTRACT

Described herein are boron-containing precursor compounds, and compositions and methods comprising same, for forming boron-containing films. In one aspect, the film is deposited from at least one precursor having the following Formula I or II described herein.

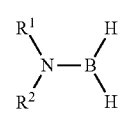

I

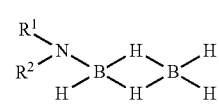

II

7 Claims, 5 Drawing Sheets

(51) Int. Cl.
C23C 16/455 (2006.01)
C07F 5/05 (2006.01)
C23C 16/34 (2006.01)
H01L 29/16 (2006.01)

(52) U.S. Cl.
CPC ............... *C07F 5/05* (2013.01); *C23C 16/34* (2013.01); *C23C 16/342* (2013.01); *C23C 16/345* (2013.01); *C23C 16/45536* (2013.01); *H01L 21/0217* (2013.01); *H01L 21/02175* (2013.01); *H01L 21/02274* (2013.01); *H01L 29/16* (2013.01)

(58) Field of Classification Search
CPC ........... C23C 16/45536; H01L 21/0217; H01L 21/02175; H01L 21/02205; H01L 21/02274; H01L 29/16
USPC .......... 257/649, 40; 438/778, 703, 780, 794; 428/690; 501/96.2
See application file for complete search history.

(56) References Cited

U.S. PATENT DOCUMENTS

| | | | | |
|---|---|---|---|---|
| 4,977,268 | A | * | 12/1990 | McPhail ................. C07F 5/027 548/110 |
| 5,128,286 | A | * | 7/1992 | Funayama ............. C08G 77/60 501/96.2 |
| 5,175,020 | A | * | 12/1992 | Doellein ............... C23C 16/342 427/250 |
| 5,204,295 | A | * | 4/1993 | Paine, Jr. .............. C03C 17/225 423/290 |
| 6,815,350 | B2 | | 11/2004 | Kim et al. |
| 6,962,876 | B2 | | 11/2005 | Ahn et al. |
| 7,179,940 | B2 | | 2/2007 | Vaultier et al. |
| 7,633,125 | B2 | | 12/2009 | Lu et al. |
| 8,288,292 | B2 | | 10/2012 | Antonelli et al. |
| 8,324,014 | B2 | | 12/2012 | Pinchart et al. |
| 8,479,683 | B2 | | 7/2013 | Antonelli et al. |
| 8,679,958 | B2 | | 3/2014 | Takamure et al. |
| 8,753,717 | B2 | | 6/2014 | Suzuki et al. |
| 2002/0057046 | A1 | * | 5/2002 | Yamamoto ............. H01J 1/316 313/311 |
| 2002/0090835 | A1 | * | 7/2002 | Chakravarti ........... C23C 16/30 438/794 |
| 2004/0044162 | A1 | * | 3/2004 | Miele ................... C04B 35/583 528/7 |
| 2005/0042888 | A1 | * | 2/2005 | Roeder .................... C07F 7/10 438/780 |
| 2005/0107633 | A1 | | 5/2005 | Vaultier et al. |
| 2005/0123789 | A1 | * | 6/2005 | Vargas ................. H01L 51/0059 428/690 |
| 2006/0115591 | A1 | | 6/2006 | Olander et al. |
| 2007/0128858 | A1 | * | 6/2007 | Haukka .................. C23C 16/34 438/656 |
| 2008/0145536 | A1 | | 6/2008 | Zhang et al. |
| 2009/0286402 | A1 | * | 11/2009 | Xia ..................... H01L 21/0337 438/703 |
| 2010/0129994 | A1 | | 5/2010 | Awad et al. |
| 2011/0195569 | A1 | | 8/2011 | Moon et al. |
| 2011/0215445 | A1 | | 9/2011 | Yang et al. |
| 2011/0230677 | A1 | * | 9/2011 | Schmidt ................ C07F 5/025 564/9 |
| 2013/0052836 | A1 | | 2/2013 | Hirose et al. |
| 2013/0115763 | A1 | | 5/2013 | Takamure et al. |
| 2013/0239893 | A1 | | 9/2013 | Suzuki et al. |
| 2014/0027664 | A1 | | 1/2014 | Lei et al. |
| 2014/0027734 | A1 | * | 1/2014 | Kwong ............... H01L 51/0071 257/40 |
| 2015/0017794 | A1 | | 1/2015 | Takamure et al. |
| 2015/0287591 | A1 | * | 10/2015 | Pore .................. C23C 16/45531 438/778 |
| 2017/0022612 | A1 | * | 1/2017 | Lei ........................ C23C 16/455 |

OTHER PUBLICATIONS

Jaska, C. A., et al, "Transition Metal-Catalyzed Formation of Boron-Nitrogen Bonds: Catalytic Dehydrocoupling of Amine-Borane Adducts to Form Aminoboranes and Borazines", J. Am. Chem. Soc., 2003, 125(31): 9424-9434.

Nutt, W.R. et al, "Reactions of ((Organosilyl)amino)(alkylamino)boranes with selected hydrides", Inorganic Chemistry, 1982, 2473-2476.

Kalutarage, Lakmal C., "Low-Temperature Atomic Layer Deposition of Copper Films Using Borane Dimethylamine as the Reducing Co-reagent", 2014 American Chemical Society, Chem. Mater. 2014, 26, 3731-3738.

Kalutarage, Lakmal C., "Volatile and Thermally Stable Mid to Late Transition Metal Complexes Containing a-Imino Alkoxide Ligands, a New Strongly Reducing Coreagent, and Thermal Atomic Layer Deposition of Ni, Co, Fe, and Cr Metal Films", 2013 American Chemical Society, J. Am. Chem, Soc. 2013, 135, 12588-12591.

Phani, A. Ratna, et al., "MOCVD Growth of Boron Nitride Films from Single Source III-V Precursors", J. Chen Soc., Chem. Commun., pp. 684-685.

Hegemann, D., et al., "Influence of single-source precursors on PACVD-derived boron carbonitirde thin films", "Thin Solid Firms", vol. 339, pp. 154-159.

Engbrecht, E.R., et al., "Adhesion of chemical vapor deposited boron carbo-nitride to dielectric and copper films", J. Mater Res., vol. 20, No. 8, pp. 2218-2224.

D'Ulivo, Alessandro, et al., "Chemical Vapor Generation Atomic Spectrometry Using Amineboranes and Cyanotrihydroborate(III) Reagents", Anal. Chem., vol. 775, No. 11, pp. 2591-2600.

Maringgele, Walter, et al., "Reduction of Piperidino- and Related Sec. Amino(Dihalogeno)Boranes With LiAlH4 in Toluene and Related Reactions", Main Group Metal Chemistry, vol. 23, No. 12, pp. 735-760.

* cited by examiner

BORON-CONTAINING COMPOUNDS, COMPOSITIONS, AND METHODS FOR THE DEPOSITION OF A BORON CONTAINING FILMS

This application claims the benefit of Application No. 62/140,570, filed on Mar. 31, 2015. The disclosure of Application No. 62/140,570 is hereby incorporated by reference.

BACKGROUND OF THE INVENTION

Described herein is a composition and method for the formation of a boron containing film or a boron-doped silicon containing film. More specifically, described herein are compounds, and composition and method comprising same, for formation of a stoichiometric or a non-stoichiometric boron-containing film or material, or a boron-doped silicon containing film at one or more deposition temperatures.

Boron compounds are needed, for example, in the fabrication of fin field effect transistors (FinFET) or other application in semiconductor industrial. Thus far, boron precursors such as boron halides (e.g., $BCl_3$), trialkylborane, or boron alkoxide precursors have been used for boron doped films.

The reference entitled "Silyl-amino boron compounds", Burg, A. B. and et al., *J. Am. Chem. Soc.*, Vol. 72: pp. 3103-3107, describes the formation of various boron compounds.

U.S. Pat. Nos. 8,288,292 and 8,479,683 describe a method of forming a boron nitride or boron carbon nitride dielectric that produces a conformal layer without a loading effect. The dielectric layer is formed by chemical vapor deposition (CVD) of a boron-containing film on a substrate, at least a portion of the deposition being conducted without plasma, and then exposing the deposited boron-containing film to a plasma. The CVD component dominates the deposition process, producing a conformal film without loading effect. The dielectric is ashable, and can be removed with a hydrogen plasma without impacting surrounding materials. The dielectric has a much lower wet etch rate compared to other front end spacer or hard mask materials such as silicon oxide or silicon nitride, and has a relatively low dielectric constant, much lower then silicon nitride.

US Publ. No. 2013/052836A describes a method for manufacturing a semiconductor device, including forming an insulating film having a prescribed composition and a prescribed film thickness on a substrate by alternately performing the following steps prescribed number of times: supplying one of the sources of a chlorosilane-based source and an aminosilane-based source to a substrate in a processing chamber, and thereafter supplying the other source, to form a first layer containing silicon, nitrogen, and carbon on the substrate; and supplying a reactive gas different from each of the sources, to the substrate in the processing chamber, to modify the first layer and form a second layer.

The reference entitled "Transition Metal-Catalyzed Formation of Boron-Nitrogen Bonds: Catalytic Dehydrocoupling of Amine-Borane Adducts to Form Aminoboranes and Borazines" *J. Am. Chem. Soc.* 125(31): 9424-9434 describes a method to make aminoboranes and borazine derivatives from either primary or secondary amine-borane adducts using late transition metal complexes as precatalysts.

U.S. Pat. No. 8,753,717 describes a film forming method for forming a thin film including boron, nitrogen, silicon, and carbon on a surface of a processing target by supplying a boron containing gas, a nitriding gas, a silane-based gas, and a hydrocarbon gas in a processing container in which the processing target is accommodated to be vacuum sucked includes: a first process which forms a boron nitride (BN) film by performing a cycle of alternately and intermittently supplying the boron-containing gas and the nitriding gas once or more; and a second process which forms a silicon carbonitride (SiCN) film by performing a cycle of intermittently supplying the silane-based gas, the hydrocarbon gas, and the nitriding gas once or more.

U.S. Publ. No. 2013/239893 describes a method for stabilizing a film forming apparatus, which can selectively perform a boron-containing nitride film forming process or a non-boron-containing nitride film forming process on at least one target object to be processed in a vacuum-evacumable processing chamber, the method includes performing a heat stabilization process to heat the interior of the processing chamber under an oxygen-containing gas atmosphere, between the boron-containing nitride film forming process and the non-boron-containing nitride film forming process when the non-boron-containing nitride film forming process is performed after the boron-containing nitride film forming process.

U.S. Pat. Nos. 6,815,350 and 6,962,876 describe a method for forming a ternary thin film using an atomic layer deposition (ALD) process includes supplying a first and a second reactive material to a chamber containing a wafer, the first and second reactive materials being adsorbing on a surface of the wafer, supplying a first gas to the chamber to purge the first and second reactive materials that remain unreacted, supplying a third reactive material to the chamber to cause a reaction between the first and second reactive materials and the third reactive material to form a thin film monolayer, supplying a second gas to purge the third reactive material that remains unreacted and a byproduct, and repeating the above steps for forming the thin film monolayer a predetermined number of times to form a ternary thin film having a predetermined thickness on the wafer. Preferably, the ternary thin film is a silicon boronitride (SiBN) film.

U.S. Pat. No. 7,633,125 describes the integration of silicon boron nitride in high voltage semiconductors. In one example, a microelectronic apparatus includes a semiconductor substrate upon which transistors of an integrated circuit are formed, a plurality of transistor gates formed upon the semiconductor substrate, a gate spacer dielectric disposed between the gates, and a contact etch stop dielectric disposed upon the gates and gate spacer dielectric, the contact etch stop dielectric comprising SiBN to reduce breakdown of the contact etch stop dielectric in high voltage applications.

U.S. Pat. No. 8,324,014 describes the deposition of boron compounds on substrates by chemical vapor deposition (CVD) or physical vapor deposition (PVD) using a boron compound precursor of general structure $R_1R_2R_3B$ ($R_1$=H, C1-5-alkyl, aryl, alkylamide, —OH, C1-5-alkoxy; $R_2$ and $R_3$ is a group that contains boron and can comprise a saturated 6-membered heterocyclic compd. (e.g., containing 3 atoms of B and 3 atoms of N), optionally substituted with C1-5-alkyl, aryl, alkylamide and C1-5-alkoxy (esp. tri-Me borate or tri-iso-Pr borate)). Specifically, the compounds can be hexa-substituted borazines, 1,3,5-tri-substituted borazines, or 2,4,6-trisubstituted borazines (esp. 1,3,5-trimethylborazine). The boron can be deposited in the presence of added material that can act as dopants for solar cell layers.

U.S. Pat. No. 3,031,503 describes the preparation of aminoboranes compounds from tetraboranes according to the following equation: $2 R_2NH+B_4H_{10} \rightarrow 2R_2NB_2H_5+H_2$ at 150-180°.

U.S. Pat. No. 8,679,958 describes the deposition of dopant films, such as doped silicon oxide films, by atomic layer deposition processes. In some embodiments, a substrate in a reaction space is contacted with pulses of a silicon precursor and a dopant precursor, such that the silicon precursor and dopant precursor adsorb on the substrate surface. Oxygen plasma is used to convert the adsorbed silicon precursor and dopant precursor to doped silicon oxide.

The disclosure of the foregoing patents, applications and literature is hereby incorporated by reference.

Thus, there is still a need to develop a process for forming a boron-containing film or a boron-doped silicon containing film using one or more boron compound in a chemical vapor deposition (CVD), an atomic layer deposition (ALD), or a plasma enhanced atomic layer deposition (ALD) process or a plasma enhanced ALD-like process.

BRIEF SUMMARY OF THE INVENTION

Described herein are precursor compounds, compositions comprising same, and methods for the deposition of a stoichiometric or nonstoichiometric boron containing material, film, or a boron-doped silicon containing film or material, such as without limitation, a boron oxide, a boron nitride, a boron carboxide, a boron carbonitride, a boron doped silicon oxide, a boron doped silicon oxynitride film, a carbon doped silicon nitride film at one or more deposition temperatures, in a plasma enhanced ALD, plasma enhanced cyclic chemical vapor deposition (PECCVD), a plasma enhanced ALD-like process, or an ALD process. In addition to boron-doped silicon films, it is anticipated that the compounds, compositions, and methods comprising same can be used for doping or incorporating boron to other metallic or non-metallic materials.

In one aspect, there is provided a boron-containing precursor having Formula I or II:

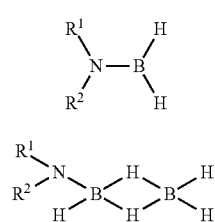

wherein $R^1$ is selected from a linear $C_1$ to $C_{10}$ alkyl group, a branched $C_3$ to $C_{10}$ alkyl group, a linear or branched $C_3$ to $C_{10}$ alkenyl group, a linear or branched $C_3$ to $C_{10}$ alkynyl group, a $C_1$ to $C_6$ dialkylamino group, an electron withdrawing group, and a $C_4$ to $C_{10}$ aryl group; $R^2$ is selected from hydrogen, a linear $C_1$ to $C_{10}$ alkyl group, a branched $C_3$ to $C_{10}$ alkyl group, a linear or branched $C_3$ to $C_6$ alkenyl group, a linear or branched $C_3$ to $C_6$ alkynyl group, a $C_1$ to $C_6$ dialkylamino group, a $C_6$ to $C_{10}$ aryl group, a linear or branched $C_1$ to $C_6$ fluorinated alkyl group, an electron withdrawing group, and a $C_4$ to $C_{10}$ aryl group; and optionally wherein $R^1$ and $R^2$ are linked together to form a ring selected from a substituted or unsubstituted aromatic ring or a substituted or unsubstituted aliphatic ring. In certain embodiments of Formula I or II, $R^1$ and $R^2$ are linked together to form a ring. In one particular embodiment, $R^1$ and $R^2$ are selected from a linear or a branched $C_3$ to $C_6$ alkyl group and are linked to form a cyclic ring. In alternative embodiments of Formula I or II, $R^1$ and $R^2$ are not linked together to form a ring. In other embodiments, $R^1$ and $R^2$ are different.

In another aspect, the boron-containing precursor comprises an organoaminoborane having Formula I. Exemplary compounds include, but are not limited to, di-iso-propylaminoborane, di-sec-butylaminoborane, N-ethyl-cyclohexylaminoborane, N-methyl-cyclohexylaminoborane, N-iso-propyl-cyclohexyaminoborane, phenylmethylaminoborane, phenylethylaminoborane, and piperidinoborane. In certain embodiments of Formula I, the organoaminoborane can be a dimeric compound such as $[Me_2NBH_2]_2$ in either liquid phase or gas phase when $R^1$ and $R^2$ are not bulky or sterically hindered alkyl groups, such as, without limitation, methyl, ethyl, pyrrolidino, and piperidino. In certain preferred embodiments of Formula I, the organoaminoborane are monomer when $R^1$ and $R^2$ are bulky, sterically hindered alkyl groups such as iso-propyl, tert-butyl, and tert-pentyl.

In yet another aspect, the boron-containing precursor comprises an organoaminodiborane having Formula II. Exemplary compounds include, but are not limited to, di-iso-propylaminodiborane, di-sec-butylaminodiborane, and 2,6-dimethylpiperidinodiborane.

In another aspect, described herein is a composition comprising:

a boron-containing precursor having Formula I or II:

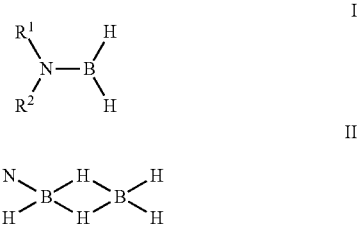

wherein $R^1$ is selected from a linear $C_1$ to $C_{10}$ alkyl group, a branched $C_3$ to $C_{10}$ alkyl group, a linear or branched $C_3$ to $C_{10}$ alkenyl group, a linear or branched $C_3$ to $C_{10}$ alkynyl group, a $C_1$ to $C_6$ dialkylamino group, an electron withdrawing group, and a $C_4$ to $C_{10}$ aryl group; $R^2$ is selected from hydrogen, a linear $C_1$ to $C_{10}$ alkyl group, a branched $C_3$ to $C_{10}$ alkyl group, a linear or branched $C_3$ to $C_6$ alkenyl group, a linear or branched $C_3$ to $C_6$ alkynyl group, a $C_1$ to $C_6$ dialkylamino group, a $C_6$ to $C_{10}$ aryl group, a linear or branched $C_1$ to $C_6$ fluorinated alkyl group, an electron withdrawing group, and a $C_4$ to $C_{10}$ aryl group; and optionally wherein $R^1$ and $R^2$ are linked together to form a ring selected from a substituted or unsubstituted aromatic ring or a substituted or unsubstituted aliphatic ring; and a solvent. In one embodiment of the composition, the solvent is at least one selected from the group consisting of: ether, tertiary amine, alkyl hydrocarbon, aromatic hydrocarbon, tertiary aminoether, and combinations thereof.

In a still further aspect, there is provided a method to deposit a boron-containing film onto at least a surface of a substrate which comprises the steps of:

providing the substrate in a reactor;

forming the boron-containing film on the surface in a deposition process selected from a chemical vapor deposition and atomic layer deposition process using a boron-containing precursor selected from a compound having the following formula I and II:

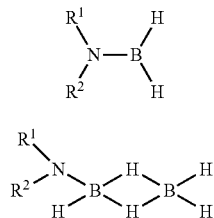

wherein $R^1$ is selected from a linear $C_1$ to $C_{10}$ alkyl group, a branched $C_3$ to $C_{10}$ alkyl group, a linear or branched $C_3$ to $C_{10}$ alkenyl group, a linear or branched $C_3$ to $C_{10}$ alkynyl group, a $C_1$ to $C_6$ dialkylamino group, an electron withdrawing group, and a $C_4$ to $C_{10}$ aryl group; $R^2$ is selected from hydrogen, a linear $C_1$ to $C_{10}$ alkyl group, a branched $C_3$ to $C_{10}$ alkyl group, a linear or branched $C_3$ to $C_6$ alkenyl group, a linear or branched $C_3$ to $C_6$ alkynyl group, a $C_1$ to $C_6$ dialkylamino group, a $C_6$ to $C_{10}$ aryl group, a linear or branched $C_1$ to $C_6$ fluorinated alkyl group, an electron withdrawing group, and a $C_4$ to $C_{10}$ aryl group; and optionally wherein $R^1$ and $R^2$ are linked together to form a ring selected from a substituted or unsubstituted aromatic ring or a substituted or unsubstituted aliphatic ring.

The various aspects of this invention can be used alone or in combinations with each other.

DETAILED DESCRIPTION OF THE INVENTION

Figure 1:
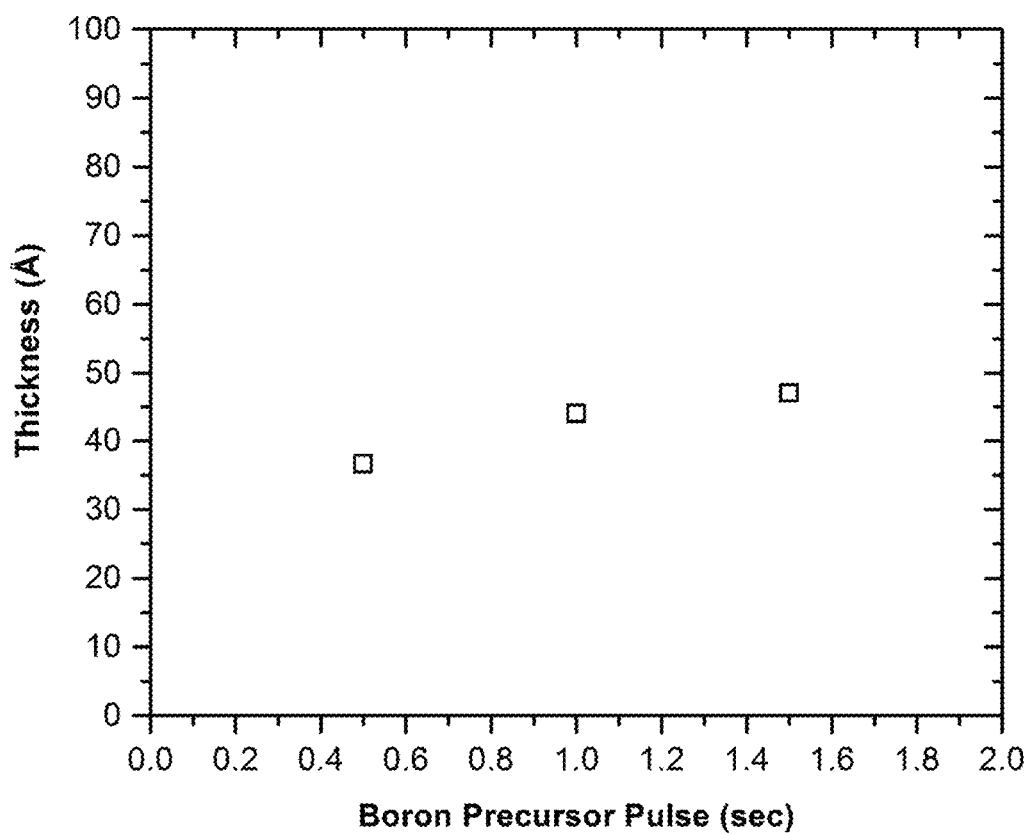
FIG. 1 provides boron nitride thickness vs di-sec-butylaminoborane (DSBAB) pulse time as described in Example 1, demonstrating DSBAB reaches ALD self-limiting at about 1 second.

Described herein are methods related to the formation of a stoichiometric or nonstoichiometric film or material comprising boron, such as without limitation a silicon oxide, a carbon-doped silicon oxide film, a silicon oxynitride, a carbon-doped silicon oxynitride, metal nitride films or combinations thereof with one or more temperatures, room temperature (e.g., about 25° C.) to about 1000° C., or from room temperature to about 400° C., or from room temperature to about 300° C., or from room temperature to about 200° C., or from room temperature to about 100° C. The films described herein are deposited in a deposition process such as, a chemical vapor deposition (CVD) process, an atomic layer deposition (ALD) or in an ALD-like process, such as without limitation, a plasma enhanced ALD or a plasma enhanced cyclic chemical vapor deposition process (CCVD).

In one embodiment, the boron-containing precursor described herein is a compound having either Formulae I or II:

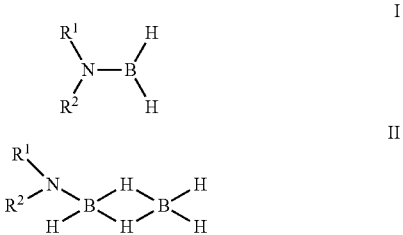

wherein $R^1$ is selected from a linear $C_1$ to $C_{10}$ alkyl group, a branched $C_3$ to $C_{10}$ alkyl group, a linear or branched $C_3$ to $C_{10}$ alkenyl group, a linear or branched $C_3$ to $C_{10}$ alkynyl group, a $C_1$ to $C_6$ dialkylamino group, an electron withdrawing group, and a $C_4$ to $C_{10}$ aryl group; $R^2$ is selected from hydrogen, a linear $C_1$ to $C_{10}$ alkyl group, a branched $C_3$ to $C_{10}$ alkyl group, a linear or branched $C_3$ to $C_6$ alkenyl group, a linear or branched $C_3$ to $C_6$ alkynyl group, a $C_1$ to $C_6$ dialkylamino group, a $C_6$ to $C_{10}$ aryl group, a linear or branched $C_1$ to $C_6$ fluorinated alkyl group, an electron withdrawing group, and a $C_4$ to $C_{10}$ aryl group; and optionally wherein $R^1$ and $R^2$ are linked together to form a ring selected from a substituted or unsubstituted aromatic ring or a substituted or unsubstituted aliphatic ring.

In certain embodiments, substituents $R^1$ and $R^2$ in formulae I or II can be linked together to form a ring structure. As the skilled person will understand, where $R^1$ and $R^2$ are linked together to form a ring and $R^1$ would include a bond for linking to $R^2$ and vice versa. In these embodiments, the ring structure can be unsaturated such as, for example, a cyclic alkyl ring, or saturated, for example, an aryl ring. Further, in these embodiments, the ring structure can also be substituted or unsubstituted with one or more atoms or groups. Exemplary cyclic ring groups include, but not limited to, pyrrolidino, piperidino, and 2, 6-dimethylpiperidino groups. In certain embodiments of Formula I, the organoaminoborane can be a dimeric such as $[Me_2NBH_2]_2$ in either liquid phase or gas phase when $R^1$ and $R^2$ are not bulky alkyls such as methyl or ethyl or pyrrolidino or piperidino. In other embodiments, however, substituent $R^1$ and $R^2$ are not linked to form a ring structure.

In other embodiments, $R^1$ and $R^2$ are different.

In other embodiments, the organoaminoborane can be dimeric when $R^1$ and $R^2$ are less bulky alkyls such as methyl, ethyl, pyrrolidino or piperidino.

In certain preferred embodiments of Formula I, the organoaminoborane are monomeric when $R^1$ and $R^2$ are bulky alkyls such as iso-propyl, tert-butyl, tert-pentyl.

Exemplary boron-containing precursor compounds having either Formulae I or II described herein include, but are not limited to, dimethylaminoborane, diethylaminoborane, ethylmethylaminoborane, di-iso-propylaminoborane, di-sec-butylaminoborane, N-ethyl-cyclohexylaminoborane, N-methyl-cyclohexylaminoborane, N-iso-propyl-cyclohexyaminoborane, phenylmethylaminoborane, phenylethylaminoborane, piperidinoborane, 2,6-dimethylpiperidinoborane, 2,2,6,6-tetramethylpiperidinoborane, di-iso-propylaminodiborane, di-sec-butylaminodiborane, and 2,6-dimethylpiperidinodiborane as shown in the structures below:

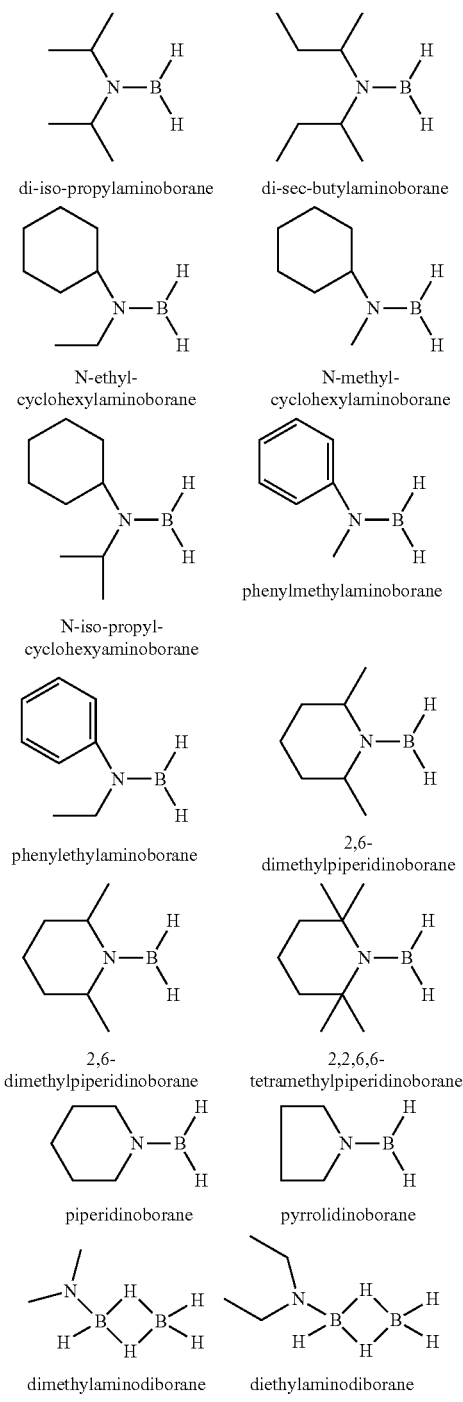

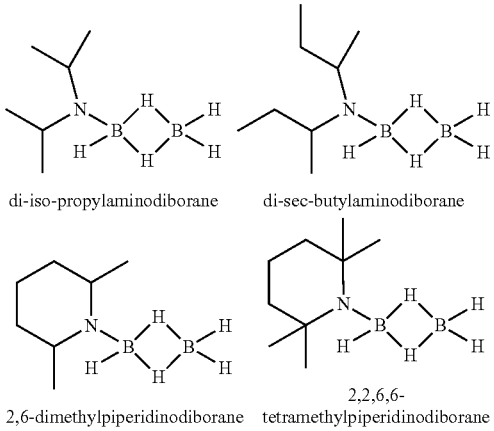

In the formulas above and throughout the description, the term "alkyl" denotes a linear or branched functional group having from 1 to 10 or from 1 to 6 carbon atoms. Exemplary linear alkyl groups include, but are not limited to, methyl, ethyl, propyl, butyl, pentyl, and hexyl groups. Exemplary branched alkyl groups include, but are not limited to, iso-propyl, iso-butyl, sec-butyl, tert-butyl, iso-pentyl, tert-pentyl, iso-hexyl, and neohexyl. In certain embodiments, the alkyl group may have one or more functional groups attached thereto such as, but not limited to, an alkoxy group, a dialkylamino group or combinations thereof, attached thereto. In other embodiments, the alkyl group does not have one or more functional groups attached thereto. The alkyl group may be saturated or, alternatively, unsaturated. The alkyl group may also be substituted or having one or more heteroatoms such as a halide or O or unsubstituted.

In the formulas above and throughout the description, the term "cyclic alkyl" denotes a cyclic functional group having from 4 to 10 carbon atoms. Exemplary cyclic alkyl groups include, but are not limited to, cyclobutyl, cyclopentyl, cyclohexyl, and cyclooctyl groups.

In the formulas above and throughout the description, the term "alkenyl group" denotes a group which has one or more carbon-carbon double bonds and has from 2 to 10 or from 2 to 10 or from 2 to 6 carbon atoms.

In the formulas above and throughout the description, the term "alkynyl group" denotes a group which has one or more carbon-carbon triple bonds and has from 3 to 10 or from 2 to 10 or from 2 to 6 carbon atoms.

In the formulas above and throughout the description, the term "aryl" denotes an aromatic cyclic functional group having from 4 to 10 carbon atoms, from 5 to 10 carbon atoms, or from 6 to 10 carbon atoms. Exemplary aryl groups include, but are not limited to, phenyl, benzyl, chlorobenzyl, tolyl, o-xylyl, 1,2,3-triazolyl, pyrrrolyl, and furanyl, pyridazinyl, pyrimidinyl, pyrazinyl, and imidazolyl.

In the formulas above and throughout the description, the term "amino" denotes an organoamino group having from 1 to 10 carbon atoms derived from an organoamines with formula of $HNR^2R^3$. Exemplary amino groups include, but are not limited to, secondary amino groups derived from secondary amines such as dimethylamino($Me_2N$—), diethyamino($Et_2N$—), ethylmethylamino (EtMeN—), di-iso-propylamino($^iPr_2N$—); primary amino groups derived from primary amines such as methylamino (MeNH—), ethylamine(EtNH—), iso-propylamino($^iPrNH$—), sec-butylamino($^sBuNH$—), tert-butylamino ('BuNH—), tert-pentylamino('AmNH—), preferably bulky primary amines such as tert-butylamine or tert-pentylamine.

The boron-containing precursor compounds described herein, such as without limitation, di-iso-propylaminoborane (DIPAB) or di-sec-butylaminoborane (DSBAB) can be prepared according to the method described by Jaska, C. A., Temple, K., Lough, A. J. and Manners, I "Transition Metal-Catalyzed Formation of Boron-Nitrogen Bonds: Catalytic Dehydrocoupling of Amine-Borane Adducts to form Aminoboranes and Borazines." J. Am. Chem. Soc. 125, 9424 (2003); hereby incorporated by reference. However, other synthetic methods can be used to make these compounds.

Also described herein is a composition comprising: (a) boron-containing precursor represented by the following Formula I and II below:

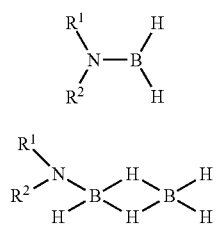

wherein $R^1$ is selected from a linear $C_1$ to $C_{10}$ alkyl group, a branched $C_3$ to $C_{10}$ alkyl group, a linear or branched $C_3$ to $C_{10}$ alkenyl group, a linear or branched $C_3$ to $C_{10}$ alkynyl group, a $C_1$ to $C_6$ dialkylamino group, an electron withdrawing group such as halides (Cl, Br, I), and a $C_6$ to $C_{10}$ aryl group; $R^2$ is selected from hydrogen, a linear $C_1$ to $C_{10}$ alkyl group, a branched $C_3$ to $C_{10}$ alkyl group, a linear or branched $C_3$ to $C_6$ alkenyl group, a linear or branched $C_3$ to $C_6$ alkynyl group, a $C_1$ to $C_6$ dialkylamino group, a $C_6$ to $C_{10}$ aryl group, a linear or branched $C_1$ to $C_6$ fluorinated alkyl group, an electron withdrawing group such as halides (Cl, Br, I), and a $C_4$ to $C_{10}$ aryl group; and (b) a solvent. In certain embodiments of the composition described herein, exemplary solvents can include, without limitation, ether, tertiary amine, alkyl hydrocarbon, aromatic hydrocarbon, tertiary aminoether, and combinations thereof. In certain embodiments, the difference between the boiling point of the organoaminodisilane and the boiling point of the solvent is 40° C. or less. It is believed that some solvent may help stabilize the organoaminoborane in either liquid phase or even gas phase during storage or delivery.

In another aspect, there is provided a method for forming a boron-containing film on at least one surface of a substrate comprising:
providing the at least one surface of the substrate in a reaction chamber; and forming the boron-containing film on the at least one surface by a deposition process chosen from a chemical vapor deposition process and an atomic layer deposition process using a boron-containing precursor represented by the following Formula I and II below:

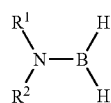

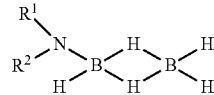

wherein $R^1$ is selected from a linear $C_1$ to $C_{10}$ alkyl group, a branched $C_3$ to $C_{10}$ alkyl group, a linear or branched $C_3$ to $C_{10}$ alkenyl group, a linear or branched $C_3$ to $C_{10}$ alkynyl group, a $C_1$ to $C_6$ dialkylamino group, an electron withdrawing group such as halides (Cl, Br, I), and a $C_6$ to $C_{10}$ aryl group; $R^2$ is selected from hydrogen, a linear $C_1$ to $C_{10}$ alkyl group, a branched $C_3$ to $C_{10}$ alkyl group, a linear or branched $C_3$ to $C_6$ alkenyl group, a linear or branched $C_3$ to $C_6$ alkynyl group, a $C_1$ to $C_6$ dialkylamino group, a $C_6$ to $C_{10}$ aryl group, a linear or branched $C_1$ to $C_6$ fluorinated alkyl group, an electron withdrawing group such as halides (Cl, Br, I), and a $C_4$ to $C_{10}$ aryl group.

In another aspect, there is provided a method of forming a boron oxide or boron carboxide film via an atomic layer deposition process or ALD-like process, the method comprising the steps of:
a. providing a substrate in a reactor;
b. introducing into the reactor at least one boron-containing precursor represented by the following Formula I and II below:

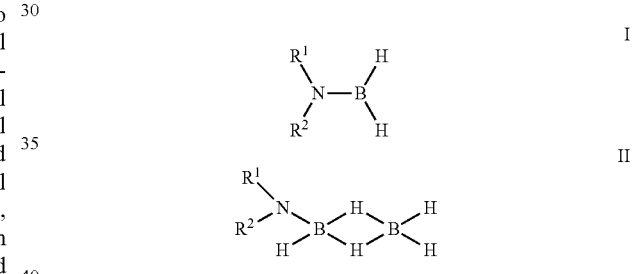

wherein $R^1$ is selected from a linear $C_1$ to $C_{10}$ alkyl group, a branched $C_3$ to $C_{10}$ alkyl group, a linear or branched $C_3$ to $C_{10}$ alkenyl group, a linear or branched $C_3$ to $C_{10}$ alkynyl group, a $C_1$ to $C_6$ dialkylamino group, an electron withdrawing group such as halides (Cl, Br, I), and a $C_6$ to $C_{10}$ aryl group; $R^2$ is selected from hydrogen, a linear $C_1$ to $C_{10}$ alkyl group, a branched $C_3$ to $C_{10}$ alkyl group, a linear or branched $C_3$ to $C_6$ alkenyl group, a linear or branched $C_3$ to $C_6$ alkynyl group, a $C_1$ to $C_6$ dialkylamino group, a $C_6$ to $C_{10}$ aryl group, a linear or branched $C_1$ to $C_6$ fluorinated alkyl group, an electron withdrawing group such as halides (Cl, Br, I), and a $C_4$ to $C_{10}$ aryl group;
c. purging the reactor with a purge gas;
d. providing an oxygen-containing source to deposit the film onto the at least one surface;
e. purging the reactor with a purge gas;
wherein steps b through e are repeated until a desired thickness of the film is obtained.

In one particular embodiment, the depositing step is conducted at one or more temperatures ranging from about room temperature to about 1000° C., or from room temperature to about 400° C., or from room temperature to about 300° C., or from room temperature to about 200° C., or from room temperature to about 100° C.

In another aspect, there is provided a method of forming a boron doped silicon oxide, boron doped silicon carboxide film via an atomic layer deposition process or ALD-like process, the method comprising the steps of:

a. providing a substrate in a reactor;

b. introducing into the reactor at least one boron-containing precursor represented by the following Formula I and II below:

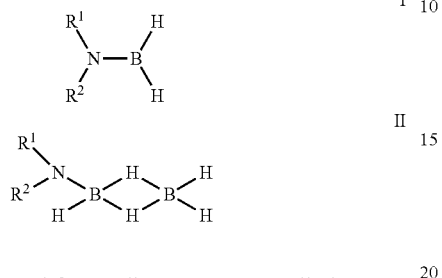

wherein $R^1$ is selected from a linear $C_1$ to $C_{10}$ alkyl group, a branched $C_3$ to $C_{10}$ alkyl group, a linear or branched $C_3$ to $C_{10}$ alkenyl group, a linear or branched $C_3$ to $C_{10}$ alkynyl group, a $C_1$ to $C_6$ dialkylamino group, an electron withdrawing group such as halides (Cl, Br, I), and a $C_6$ to $C_{10}$ aryl group; $R^2$ is selected from hydrogen, a linear $C_1$ to $C_{10}$ alkyl group, a branched $C_3$ to $C_{10}$ alkyl group, a linear or branched $C_3$ to $C_6$ alkenyl group, a linear or branched $C_3$ to $C_6$ alkynyl group, a $C_1$ to $C_6$ dialkylamino group, a $C_6$ to $C_{10}$ aryl group, a linear or branched $C_1$ to $C_6$ fluorinated alkyl group, an electron withdrawing group such as halides (Cl, Br, I), and a $C_4$ to $C_{10}$ aryl group;

c. purging the reactor with a purge gas;

d. providing an oxygen-containing source to deposit the film onto the at least one surface;

e. purging the reactor with a purge gas;

f. introducing into the reactor at least one silicon-containing source;

g. purging the reactor with a purge gas;

h. providing an oxygen-containing source to deposit the film onto the at least one surface;

i. purging the reactor with a purge gas;

wherein steps b through i are repeated until a desired thickness of the film is obtained. In some embodiments, steps b to e are repeated and then step f to i are repeated to deposit a nanolaminate layer consisting boron oxide and silicon oxide. In other embodiments, step f to i can be performed and repeated, followed by repeating steps b to e. For the nanolaminate, the thickness of silicon oxide can range from 1 Å to 5000 Å, 10 Å to 2000 Å, 50 Å to 1500 Å, 50 Å to 1000 Å, 50 Å to 500 Å whereas the thickness of boron oxide ranges from 1 Å to 5000 Å, 10 Å to 2000 Å, 50 Å to 1500 Å, 50 Å to 1000 Å, 50 Å to 500 Å. In one particular embodiment, the depositing step is conducted at one or more temperatures ranging from about room temperature to about 1000° C., or from room temperature to about 400° C., or from room temperature to about 300° C., or from room temperature to about 200° C., or from room temperature to about 100° C. In another particular embodiment, the deposition step is conducted at temperature less than 200° C. when a silicon-containing source has at least one $SiH_3$ group such as di-iso-propylaminosilane, di-sec-butylaminosilane, di-iso-propylaminodisilane, di-sec-butylaminodisilane is being employed.

In yet another aspect, there is provided a method of forming a boron nitride, boron carbonitride, boron carboxynitride film via an atomic layer deposition process or ALD-like process, the method comprising the steps of:

a. providing a substrate in a reactor;

b. introducing into the reactor at least one boron-containing precursor represented by the following Formula I and II below:

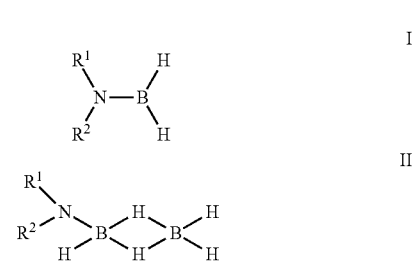

wherein $R^1$ is selected from a linear $C_1$ to $C_{10}$ alkyl group, a branched $C_3$ to $C_{10}$ alkyl group, a linear or branched $C_3$ to $C_{10}$ alkenyl group, a linear or branched $C_3$ to $C_{10}$ alkynyl group, a $C_1$ to $C_6$ dialkylamino group, an electron withdrawing group such as halides (Cl, Br, I), and a $C_6$ to $C_{10}$ aryl group; $R^2$ is selected from hydrogen, a linear $C_1$ to $C_{10}$ alkyl group, a branched $C_3$ to $C_{10}$ alkyl group, a linear or branched $C_3$ to $C_6$ alkenyl group, a linear or branched $C_3$ to $C_6$ alkynyl group, a $C_1$ to $C_6$ dialkylamino group, a $C_6$ to $C_{10}$ aryl group, a linear or branched $C_1$ to $C_6$ fluorinated alkyl group, an electron withdrawing group such as halides (Cl, Br, I), and a $C_4$ to $C_{10}$ aryl group;

c. purging the reactor with a purge gas;

d. providing a nitrogen-containing source to deposit the film onto the at least one surface;

e. purging the reactor with a purge gas;

wherein steps b through e are repeated until a desired thickness of the film is obtained. In one particular embodiment, the depositing step is conducted at one or more temperatures ranging from about room temperature to about 1000° C., or from room temperature to about 400° C., or from room temperature to about 300° C., or from room temperature to about 200° C., or from room temperature to about 100° C.

In another aspect, there is provided a method of forming a boron doped silicon nitride, boron doped silicon carbonitride, boron doped silicon carboxynitride film via an atomic layer deposition process or ALD-like process, the method comprising the steps of:

a. providing a substrate in a reactor;

b. introducing into the reactor at least one boron-containing precursor represented by the following Formula I and II below:

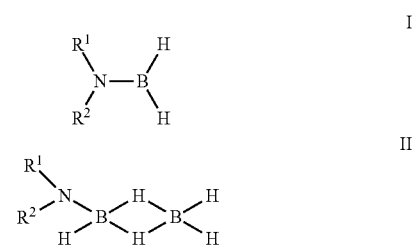

herein R¹ is selected from a linear $C_1$ to $C_{10}$ alkyl group, a branched $C_3$ to $C_{10}$ alkyl group, a linear or branched $C_3$ to $C_{10}$ alkenyl group, a linear or branched $C_3$ to $C_{10}$ alkynyl group, a $C_1$ to $C_6$ dialkylamino group, an electron withdrawing group such as halides (Cl, Br, I), and a $C_6$ to $C_{10}$ aryl group; R² is selected from hydrogen, a linear $C_1$ to $C_{10}$ alkyl group, a branched $C_3$ to $C_{10}$ alkyl group, a linear or branched $C_3$ to $C_6$ alkenyl group, a linear or branched $C_3$ to $C_6$ alkynyl group, a $C_1$ to $C_6$ dialkylamino group, a $C_6$ to $C_{10}$ aryl group, a linear or branched $C_1$ to $C_6$ fluorinated alkyl group, an electron withdrawing group such as halides (Cl, Br, I), and a $C_4$ to $C_{10}$ aryl group;

c. purging the reactor with a purge gas;
d. providing an nitrogen-containing source to deposit the film onto the at least one surface;
e. purging the reactor with a purge gas;
f. introducing into the reactor at least one silicon-containing source;
g. purging the reactor with a purge gas;
h. providing a nitrogen-containing source to deposit the film onto the at least one surface;
i. purging the reactor with a purge gas;

wherein steps b through g are repeated until a desired thickness of the film is obtained. In some embodiments, steps b to e are repeated and then step f to i are repeated to deposit a nanolaminate layer consisting boron nitride and silicon nitride. In other embodiments, step f to i can be performed and repeated first, followed by repeating steps b to e. For the nanolaminate, the thickness of silicon nitride can range from 1 Å to 5000 Å, 10 Å to 2000 Å, 50 Å to 1500 Å, 50 Å to 1000 Å, 50 Å to 500 Å whereas the thickness of boron nitride ranges from 1 Å to 5000 Å, 10 Å to 2000 Å, 50 Å to 1500 Å, 50 Å to 1000 Å, 50 Å to 500 Å. one particular embodiment, the depositing step is conducted at one or more temperatures ranging from about room temperature to about 1000° C., or from room temperature to about 400° C., or from room temperature to about 300° C., or from room temperature to about 200° C., or from room temperature to about 100° C. In another particular embodiment, the deposition step is conducted at temperature less than 200° C. when a silicon-containing source has at least one $SiH_3$ group such as di-iso-propylaminosilane, di-sec-butylaminosilane, di-iso-propylaminodisilane, di-sec-butylaminodisilane is being employed.

In embodiments of the method wherein a silicon-containing source is used, the silicon-containing source includes, but not limited to, trisilylamine (TSA), bis(disiylamino)silane $(SiH_2(N(SiH_3)_2)_2)$, bis(tert-butylamino)silane (BTBAS), bis(dimethylamino)silane, bis(diethylamino)silane, bis(ethylmethylamino)silane, tris(dimethylamino)silane, tris(ethylmethylamino)silane, tetrakis)dimethylamino)silane, di-iso-propylaminosilane, di-sec-butylaminosilane, di-tert-butylaminosilane, 2,6-dimethylpiperidinosilane, 2,2,6,6-tetramethylpiperidinosilane, cyclohexyl-iso-propylaminosilane, phenylmethylaminosilane, phenylethylaminodisilane, di-cyclohexylaminosilane, di-iso-propylaminodisilane, di-sec-butylaminodisilane, di-tert-butylaminodisilane, 2,6-dimethylpiperidinodisilane, 2,2,6,6-tetramethylpiperidinodisilane, cyclohexyl-iso-propylaminodisilane, phenylmethylaminodisilane, phenylethylaminodisilane, di-cyclohexylaminodisilane, dimethylaminotrimethylsilane, dimethylaminotrimethylsilane, di-iso-propylaminotrimethylsilane, piperidinotrimethylsilane, 2,6-dimethylpiperidinotrimethylsilane, di-sec-butylaminotrimethylsilane, iso-propyl-sec-butylaminotrimethylsilane, tert-butylaminotrimethylsilane, iso-propylaminotrimethylsilane, diethylaminodimethylsilane, dimethylaminodimethylsilane, di-iso-propylaminodimethylsilane, piperidinodimethylsilane, 2,6-dimethylpiperidinodimethylsilane, di-sec-butylaminodimethylsilane, iso-propyl-sec-butylaminodimethylsilane, tert-butylaminodimethylsilane, iso-propylaminodimethylsilane, tert-pentylaminodimethylaminosilane, bis(dimethylamino)methylsilane, bis(diethylamino)methylsilane, bis(di-iso-propylamino)methylsilane, bis(iso-propyl-sec-butylamino)methylsilane, bis(2,6-dimethylpiperidino)methylsilane, bis(iso-propylamino)methylsilane, bis(tert-butylamino)methylsilane, bis(sec-butylamino)methylsilane, bis(tert-pentylamino)methylsilane, diethoxymethylsilane, dimethoxymethylsilane, di(tertiary)butoxymethylsilane, methyltriacetatoxysilane, dimethylacetatoxysilane, dimethyldiacetoxysilane, dimethyldimethoxysilane, dimethyldiethoxysilane, methyltriethoxysilane, neohexyltriethoxysilane, neopentyltrimethoxysilane, diacetoxymethylsilane, phenyldimethoxysilane, phenyldiethoxysilane, phenyltriethoxysilane, phenyltrimethoxysilane, phenylmethyldimethoxysilane, 1,3,5,7-tetramethyltetracyclosiloxane, octamethyltetracyclosiloxane, 1,1,3,3-tetramethyldisiloxane, 1-neohexyl-1,3,5,7-tetramethylcyclotetrasiloxane, hexamethyldisiloxane, 1,3-dimethyl-1-acetoxy-3-ethoxydisiloxane, 1,2-diemthyl-1,2-diacetoxy-1,2-diethoxydisilane, 1,3-dimethyl-1,3-diethoxydisiloxane, 1,3-dimethyl-1,3-diacetoxydisilxane, 1,2-dimethyl,1,1,2,2-tetraacetoxydisilane, 1,2-dimethyl-1,1,2,2-tetraethoxydisilane, 1,3-dimethyl-1-acetoxy-3-ethoxydisiloxane, 1,2-dimethyl-1-acetoxy-2-ethoxydisilane, methylacetoxy(tertiary)butoxysilane, methylsilane, dimethylsilane, trimethylsilane, tetramethylsilane, hexamethyldisilane, tetramethyldisilane, and dimethyldisilane, hexamethyldisiloxane (HMDSO), octamethylcyclotetrasiloxane (OMCTS) and tetramethylcyclotetrasiloxane (TMCTS)), bis(triethoxysilyl)methane, bis(triethoxysilyl)ethane, bis(trimethoxysilyl)methane, bis(trimethoxysilyl)ethane, bis(diethoxymethylsilyl)methane, bis(diethoxymethylsilyl)ethane, bis(methyldiethoxysilyl)methane, (diethoxymethylsilyl)(diethoxysilyl)methane.

In another aspect, there is provided a method of forming a boron doped metal nitride, boron doped metal carbonitride, boron doped metal carboxynitride film via an atomic layer deposition process or ALD-like process, the method comprising the steps of:

a. providing a substrate in a reactor;
b. introducing into the reactor at least one boron-containing precursor represented by the following Formula I and II below:

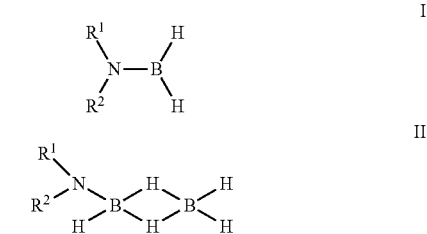

herein R¹ is selected from a linear $C_1$ to $C_{10}$ alkyl group, a branched $C_3$ to $C_{10}$ alkyl group, a linear or branched $C_3$ to $C_{10}$ alkenyl group, a linear or branched $C_3$ to $C_{10}$ alkynyl group, a $C_1$ to $C_6$ dialkylamino group, an electron withdrawing group such as halides (Cl, Br, I), and a $C_6$ to $C_{10}$ aryl group; R² is selected from hydrogen, a linear $C_1$ to $C_{10}$ alkyl group, a branched $C_3$ to $C_{10}$ alkyl group, a linear or branched $C_3$ to $C_6$ alkenyl group, a linear or branched $C_3$ to $C_6$ alkynyl group, a $C_1$ to $C_6$ dialkylamino group, a $C_6$ to $C_{10}$ aryl group, a linear or branched $C_1$ to $C_6$ fluorinated alkyl group, an electron withdrawing group such as halides (Cl, Br, I), and a $C_4$ to $C_{10}$ aryl group;
  c. purging the reactor with a purge gas;
  d. providing a nitrogen-containing source to deposit the film onto the at least one surface;
  e. purging the reactor with a purge gas;
  f. introducing into the reactor at least one metal-containing source;
  g. purging the reactor with a purge gas;
  h. providing a nitrogen-containing source to deposit the film onto the at least one surface;
  i. purging the reactor with a purge gas;
wherein steps b through g are repeated until a desired thickness of the film is obtained. In some embodiments, steps b to e are repeated and then step f to i are repeated to deposit a nanolaminate layer consisting boron nitride and metal nitride. In other embodiments, step f to i can be performed and repeated first, followed by repeating steps b to e. For the nanolaminate, the thickness of metal nitride can range from 1 Å to 5000 Å, 10 Å to 2000 Å, 50 Å to 1500 Å, 50 Å to 1000 Å, 50 Å to 500 Å whereas the thickness of boron nitride ranges from 1 Å to 5000 Å, 10 Å to 2000 Å, 50 Å to 1500 Å, 50 Å to 1000 Å, 50 Å to 500 Å. one particular embodiment, the depositing step is conducted at one or more temperatures ranging from about room temperature to about 1000° C., or from room temperature to about 400° C., or from room temperature to about 300° C., or from room temperature to about 200° C., or from room temperature to about 100° C.

In embodiments of the method wherein a metal-containing source is used, the metal-containing source includes, but not limited to, trimethylaluminum, triethylaluminum, tris(dimethylamino)aluminum, tris(ethylmethylamino)aluminum, alkylaluminum chlorides (for example methylaluminum chloride, DMACl), AlCl$_3$, trimethylaluminum (TMA), triethylaluminum, methylaluminum chloride (MeAlCl$_2$), tris(dimethylamino)aluminum (TDMAA), tris(dimethylamino)aluminum (TDMAA), and tris(diethylamino)aluminum (TDEAA), zirconium chloride (ZrCl$_4$), tetrakis(dimethylamino)zirconium (TDMAZ), tetrakis(diethylamino)zirconium (TDEAZ), tetrakis(ethylmethylamino)zirconium (TEMAZ), tetrakis(dimethylamino)hafnium (TDMAH), tetrakis(diethylamino)hafnium (TDEAH), and tetrakis(ethylmethylamino)hafnium (TEMAH), titanium chloride (TiCl$_4$), tetrakis(dimethylamino)titanium (TDMAT), tetrakis(diethylamino)titanium (TDEAT), tetrakis(ethylmethylamino)titanium (TEMAT), vanadium chloride, tetrakis(dimethylamino)tvanadium (TDMAV), tetrakis(diethylamino)vanadium (TDEAV), tetrakis(ethylmethylamino)vanadium (TEMAV), tantalum chloride (TaCl$_5$), tert-butylimino tri(diethylamino) tantalum (TBTDET), tert-butylimino tri(dimethylamino) tantalum (TBTDMT), tert-butylimino tri(ethylmethylamino)tantalum (TBTEMT), ethylimino tri(diethylamino) tantalum (EITDET), ethylimino tri(dimethylamino)tantalum (EITDMT), ethylimino tri(ethylmethylamino)tantalum (EITEMT), tert-amylimino tri(dimethylamino)tantalum (TAIMAT), tert-amylimino tri(diethylamino)tantalum, pentakis(dimethylamino)tantalum, tert-amylimino tri(ethylmethylamino)tantalum, tungsten hexafluoride, tungsten hexachloride, tungsten pentachloride, bis(tert-butylimino) bis(dimethylamino)tungsten (BTBMW), bis(tert-butylimino)bis(diethylamino)tungsten, bis(tert-butylimino)bis(ethylmethylamino)tungsten, and combinations thereof.

Throughout the description, the term "boron doped silicon nitride" denotes a boron containing film having boron content of 0.5 to 50 at % based XPS, preferably 0.5 to 20 at %, most preferably 0.5 to 8 at % or 0.5 to 10 at %.

Throughout the description, the term "boron doped silicon carbonitride" denotes a boron containing film having boron content of 0.5 to 50 at % based XPS, preferably 0.5 to 20 at %, most preferably 0.5 to 8 at % or 0.5 to 10 at %.

Throughout the description, the term "boron doped silicon carboxynitride" denotes a boron containing film having boron content of 0.5 to 50 at % based XPS, preferably 0.5 to 20 at %, most preferably 0.5 to 8 at % or 0.5 to 10 at %.

Throughout the description, the term "boron doped silicon oxide" denotes a boron containing film having boron content of 0.5 to 50 at % based XPS, preferably 0.5 to 20 at % based XPS, most preferably 0.5 to 10 at % based XPS.

Throughout the description, the term "boron doped metal nitride" denotes a boron containing film having boron content of 0.5 to 50 at % based XPS, preferably 0.5 to 20 at %, most preferably 0.5 to 8 at % or 0.5 to 10 at %. The metal nitride includes, but not limited to, titanium nitride, zirconium nitride, hafnium nitride, tantalum nitride, vanadium nitride, aluminum nitride, tungsten nitride and combinations thereof.

Throughout the description, the term "boron doped metal carbonitride" denotes a boron containing film having boron content of 0.5 to 50 at % based XPS, preferably 0.5 to 20 at %, most preferably 0.5 to 8 at % or 0.5 to 10 at %. The metal carbonitride includes, but not limited to, titanium carbonitride, zirconium carbonitride, hafnium carbonitride, vanadium carbonitride, tantalum carbonitride, aluminum carbonitride, tungsten carbonitride and combinations thereof.

Throughout the description, the term "boron doped metal carboxynitride" denotes a boron containing film having boron content of 0.5 to 50 at % based XPS, preferably 0.5 to 20 at %, most preferably 0.5 to 8 at % or 0.5 to 10 at %. The metal carboxynitride includes, but not limited to, titanium carboxynitride, zirconium carboxynitride, hafnium carboxynitride, vanadium carboxynitride, tantalum carboxynitride, aluminum carboxynitride, tungsten c carboxynitride and combinations thereof.

Throughout the description, the term "conformality or step coverage" as used herein is defined as a percentage of two thicknesses of the deposited boron doped silicon nitride dielectric boron doped metal nitride film in a structured or featured substrate having either vias or trenches or both, with bottom step coverage being the ratio (in %): thickness at the bottom of the feature is divided by thickness at the top of the feature, and middle step coverage being the ratio (in %): thickness on a sidewall of the feature is divided by thickness at the top of the feature. Films deposited using the method described herein exhibit a step coverage of about 60% or greater, about 70% or greater, about 80% or greater, or about 90% or greater which indicates that the films are conformal.

The deposition methods disclosed herein may involve one or more purge gases. The purge gas, which is used to purge away unconsumed reactants and/or reaction byproducts, is an inert gas that does not react with the precursors. Exemplary purge gases include, but are not limited to, argon (Ar), nitrogen ($N_2$), helium (He), neon, hydrogen ($H_2$), and mixtures thereof. In certain embodiments, a purge gas such as Ar is supplied into the reactor at a flow rate ranging from about 10 to about 2000 sccm for about 0.1 to 1000 seconds, thereby purging the unreacted material and any byproduct that may remain in the reactor.

In certain embodiments, the boron oxide, boron silicon oxide or boron doped silicon carboxide films deposited using the methods described herein are formed in the presence of oxygen-containing source such as ozone, water ($H_2O$) (e.g., deionized water, purifier water, and/or distilled water), oxygen ($O_2$), ozone plasma, oxygen plasma, NO, $N_2O$, $NO_2$, carbon monoxide (CO), carbon dioxide ($CO_2$) and combinations thereof. The oxygen-containing source gas can be passed through a plasma generator in situ or remote to provide oxygen-containing plasma source comprising oxygen such as an oxygen plasma, an oxygen/argon plasma, an oxygen/helium plasma, an ozone plasma, a water plasma, a nitrous oxide plasma, or a carbon dioxide plasma.

In certain embodiments, the boron-containing films comprise boron, silicon and nitrogen to provide a boron nitride, boron doped silicon nitride or boron doped silicon carbonitride film. In these embodiments, the boron-containing films deposited using the methods described herein are formed in the presence of nitrogen-containing source. A nitrogen-containing source may be introduced into the reactor in the form of at least one nitrogen source and/or may be present incidentally in the other precursors used in the deposition process. Suitable nitrogen-containing source gases may include, for example, ammonia, hydrazine, monoalkylhydrazine (e.g., methylhydrazine, tert-butylhydrazine), dialkylhydrazine (e.g., 1,1-dimethylhydrazine, 1,2-dimethylhydrazine), organoamine (e.g., methylamine, dimethylamine, ethylamine, diethylamine, tert-butylamine, ethylenediamine), organoamine plasma, nitrogen, nitrogen plasma, nitrogen/hydrogen, nitrogen/helium, nitrogen/argon plasma, ammonia plasma, ammonia/helium plasma, ammonia/argon plasma, ammonia/nitrogen plasma, $NF_3$, $NF_3$ plasma, and mixtures thereof.

In certain embodiments, the boron-containing films comprise boron content ranging from 0.5 to 50% measured by XPS, preferably 1 to 20% and can be selected form the group consisting of boron oxide, boron nitride, boron carbonitride, boron doped silicon oxide, boron doped silicon carboxide, a boron doped silicon oxynitride, boron doped silicon nitride, boron doped silicon carbonitride which can be employed in the fabrication of semi-conductor processes such as solid state diffusion layer for production of FinFET.

In certain embodiments, the resultant boron-containing films can be exposed to a post-deposition treatment such as, but not limited to, a plasma treatment, chemical treatment, ultraviolet light exposure, infrared exposure, electron beam exposure, and/or other treatments to affect one or more properties of the film.

The respective step of supplying the boron-containing precursors, oxygen source, and/or other precursors, source gases, and/or reagents may be performed by changing the time for supplying them to change the stoichiometric composition of the resulting film.

Energy is applied to the at least one of the precursors, oxygen containing source, or combination thereof to induce reaction and to form the film or coating on the substrate. Such energy can be provided by, but not limited to, thermal, plasma, pulsed plasma, helicon plasma, high density plasma, inductively coupled plasma, X-ray, e-beam, photon, remote plasma methods, and combinations thereof. In certain embodiments, a secondary RF frequency source can be used to modify the plasma characteristics at the substrate surface. In embodiments wherein the deposition involves plasma, the plasma-generated process may comprise a direct plasma-generated process in which plasma is directly generated in the reactor, or alternatively, a remote plasma-generated process in which plasma is generated outside of the reactor and supplied into the reactor.

The at least one precursors may be delivered to the reaction chamber such as a plasma enhanced cyclic CVD or PEALD reactor or a batch furnace type reactor in a variety of ways. In one embodiment, a liquid delivery system may be utilized. In an alternative embodiment, a combined liquid delivery and flash vaporization process unit may be employed, such as, for example, the turbo vaporizer manufactured by MSP Corporation of Shoreview, Minn., to enable low volatility materials to be volumetrically delivered, which leads to reproducible transport and deposition without thermal decomposition of the precursor. In liquid delivery formulations, the precursors described herein may be delivered in neat liquid form, or alternatively, may be employed in solvent formulations or compositions comprising same. Thus, in certain embodiments the precursor formulations may include solvent component(s) of suitable character as may be desirable and advantageous in a given end use application to form a film on a substrate.

For those embodiments wherein the precursor described herein is used in a composition comprising a solvent and an at least one boron-containing precursor and optionally silicon-containing precursor described herein, the solvent or mixture thereof selected does not react with the boron-containing precursor. The amount of solvent by weight percentage in the composition ranges from 0.5% by weight to 99.5% or from 10% by weight to 75%. In this or other embodiments, the solvent has a boiling point (b.p.) similar to the b.p. of the precursor or the difference between the b.p. of the solvent and the b.p. of the precursor is 40° C. or less, 30° C. or less, or 20° C. or less, or 10° C. or less. Alternatively, the difference between the boiling points ranges from any one or more of the following end-points: 0, 10, 20, 30, or 40° C. Examples of suitable ranges of b.p. difference include without limitation, 0 to 40° C., 20° to 30° C., or 10° to 30° C. Examples of suitable solvents in the compositions include, but are not limited to, an ether (such as 1,4-dioxane, dibutyl ether), a tertiary amine (such as pyridine, 1-methylpiperidine, 1-ethylpiperidine, N,N'-Dimethylpiperazine, N,N,N',N'-Tetramethylethylenediamine), a nitrile (such as benzonitrile), an alkane (such as octane, nonane, dodecane, ethylcyclohexane), an aromatic hydrocarbon (such as toluene, mesitylene), a tertiary aminoether (such as bis(2-dimethylaminoethyl) ether), or mixtures thereof.

As previously mentioned, the purity level of the boron-containing precursor is sufficiently high enough to be acceptable for reliable semiconductor manufacturing. In certain embodiments, the precursor described herein comprise less than 2% by weight, or less than 1% by weight, or less than 0.5% by weight of one or more of the following impurities: free amines, free halides or halogen ions, and higher molecular weight species. Higher purity levels of the precursor described herein can be obtained through one or more of the following processes: purification, adsorption, and/or distillation.

In one embodiment of the method described herein, a plasma enhanced cyclic deposition process such as PEALD-like or PEALD may be used wherein the deposition is conducted using the precursor(s) and an oxygen-containing or nitrogen-containing source. The PEALD-like process is defined as a plasma enhanced cyclic CVD process but still provides high conformal boron-containing films.

In certain embodiments, the gas lines connecting from the precursor canisters to the reaction chamber are heated to one or more temperatures depending upon the process requirements and the container of the precursor is kept at one or more temperatures for bubbling. In other embodiments, a solution comprising the precursor is injected into a vaporizer kept at one or more temperatures for direct liquid injection.

A flow of argon and/or other gas may be employed as a carrier gas to help deliver the vapor of the at least one silicon precursor to the reaction chamber during the precursor pulsing. In certain embodiments, the reaction chamber process pressure is about 50 mTorr to 10 Torr. In other embodiments, the reaction chamber process pressure can be up to 760 Torr In a typical PEALD or a PEALD-like process such as a PECCVD process, the substrate such as a silicon oxide substrate is heated on a heater stage in a reaction chamber that is exposed to the precursor initially to allow the complex to chemically adsorb onto the surface of the substrate.

As previously mentioned, a purge gas such as argon purges away unabsorbed excess complex from the process chamber. After sufficient purging, an oxygen source may be introduced into reaction chamber to react with the absorbed surface followed by another gas purge to remove reaction by-products from the chamber. The process cycle can be repeated to achieve the desired film thickness. In some cases, pumping can replace a purge with inert gas or both can be employed to remove unreacted precursors.

In this or other embodiments, it is understood that the steps of the methods described herein may be performed in a variety of orders, may be performed sequentially, may be performed concurrently (e.g., during at least a portion of another step), and any combination thereof. The respective step of supplying the precursors and the oxygen-containing or nitrogen-containing source gases may be performed by varying the duration of the time for supplying them to change the stoichiometric composition of the resulting dielectric film. Also, purge times after precursor or oxygen-containing or nitrogen-containing steps can be minimized to <0.1 s so that throughput can be improved.

Various commercial ALD reactors such as single wafer, semi-batch, batch furnace or roll to roll reactor can be employed for depositing the boron-containing film or materials described herein.

Process temperature for the method described herein use one or more of the following temperatures as endpoints: 0, 25, 50, 75, 100, 125, 150, 175, 200, 225, 250, 275, 300, 325, 350, 375, 400, 425, 450, 500, 525, 550, 575, 600, 625, 650, 675, 700, 725, 750, 775, 800, 825, 850, 875, 900, 925, 950, 975, and 1000° C. Exemplary temperature ranges include, but are not limited to the following: from about 0° C. to about 1000° C.; or from about 25° C. to about 1000° C.; or from about 150° C. to about 900° C.; or from about 25° C. to about 250° C., or from about 25° C. to about 200° C.

As mentioned previously, the method described herein may be used to deposit a boron-containing film on at least a portion of a substrate. Examples of suitable substrates include but are not limited to, silicon, SiO2, $Si_3N_4$, OSG, FSG, silicon carbide, hydrogenated silicon carbide, silicon nitride, hydrogenated silicon nitride, silicon carbonitride, hydrogenated silicon carbonitride, boronitride, antireflective coatings, photoresists, germanium, germanium-containing, boron-containing, Ga/As, a flexible substrate, organic polymers, porous organic and inorganic materials, metals such as copper and aluminum, and diffusion barrier layers such as but not limited to TiN, Ti(C)N, TaN, Ta(C)N, Ta, W, or WN. The films are compatible with a variety of subsequent processing steps such as, for example, chemical mechanical planarization (CMP) and anisotropic etching processes.

The following examples illustrate the method for depositing boron-containing films and boron-doped silicon nitride or boron doped metal nitride films described herein and are not intended to limit it in any way the appended claims.

EXAMPLES

In the following examples, unless stated otherwise, properties were obtained from sample films that were deposited onto medium resistivity (14-17 Ω-cm) single crystal silicon wafer substrates. All film depositions were performed using the CN-1 reactor which has a showerhead design and uses 13.56 MHz direct plasma In typical process conditions, unless stated otherwise, the chamber pressure was fixed at a pressure ranging from about 1 to about 5 torr. Additional inert gas such as argon or nitrogen was used to maintain chamber pressure. The organoborane precursor, metal precursor and organoaminosilane precursor were delivered using vapor draw or bubbling. Typical RF power used was 125 W over electrode area of 150 mm wafer to provide a power density of 0.7 W/cm².

The refractive index (RI) and thickness for the deposited films were measured either using an ellipsometer (e.g., Ellipso Technology's model Elli-SE-UaM12 at room temperature) or transmission electron microscopy (JEOL's HRTEM, model JEM-3010). Film composition was analyzed using Dynamic Secondary Ion Mass Spectrometry (DSIMS), Ulvac-Phi's model Adept-1010. All measurements were conducted in accordance with conventional methods.

Comparable Example 1. PEALD Boron Nitride Film Tris(dimethylamino)borane (TDMAB), and Nitrogen Plasma The silicon wafer was loaded into the CN-1 reactor equipped with showerhead design with 13.56 MHz direct plasma and heated to 300° C. with chamber pressure of 2 torr. A well-known boron-containing precursor, tris(dimethylamino)borane (TDMAB), was used as boron precursor and delivered to the reaction chamber using the vapor draw method. The ALD cycle was comprised of the following process steps:

a. Prepare the reactor and load wafer
 Chamber pressure: 2 torr
 b. Introduce the boron-containing precursor to the reactor
 Total flow $N_2$ flow: 1000 sccm
 TDMAB pulse: 0.5 second
 c. Purge
 Total flow of $N_2$:1000 sccm
 Purge time: 10 seconds
 d. Introduce plasma
 Total flow $N_2$ flow: 1000 sccm
 Plasma power: 125 W
 Plasma pulse: 10 second
 e. Purge
 Total flow of $N_2$: 1000 sccm
 Purge time: 10 seconds Steps b to e were repeated for 200 cycles, 400 cycles, and 600 cycles respectively. The growth rate for born nitride was calculated from a graph of thickness vs number of cycles as 0.10 Å/cycle.

Figure 2:
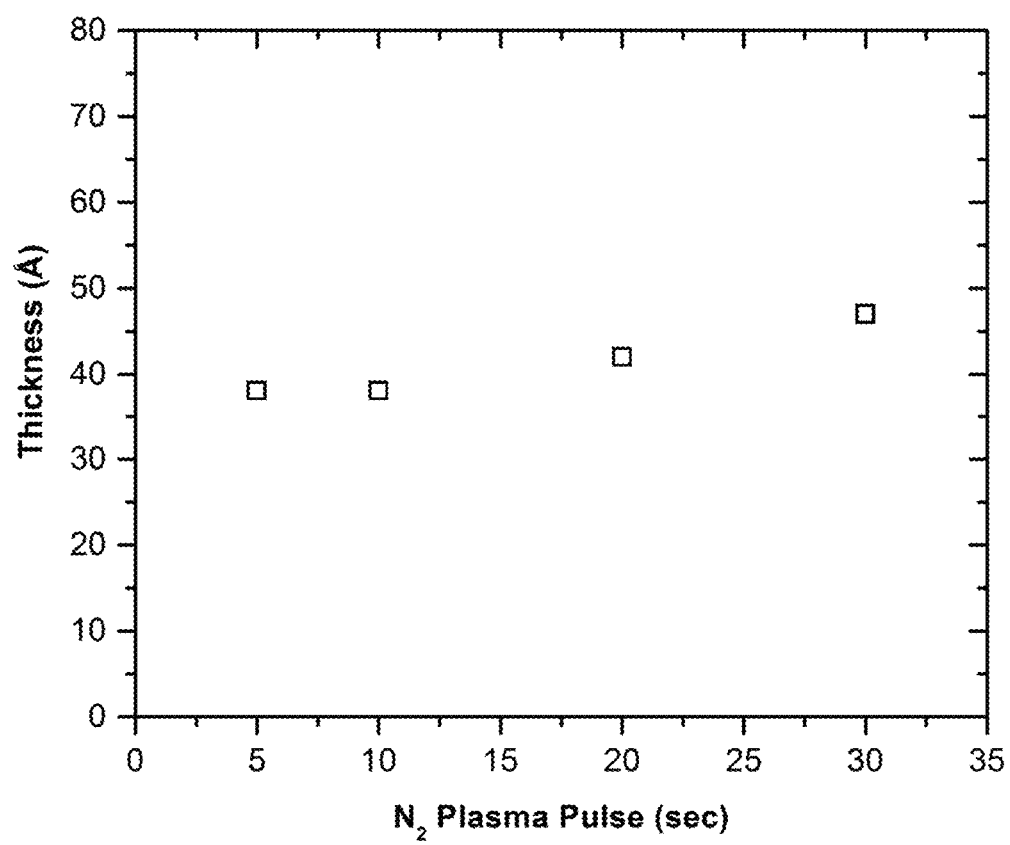
FIG. 2 provides boron nitride thickness vs $N_2$ plasma pulse time as described in Example 1, demonstrating $N_2$ plasma reaches ALD self-limiting at about 10 seconds.
Figure 3:
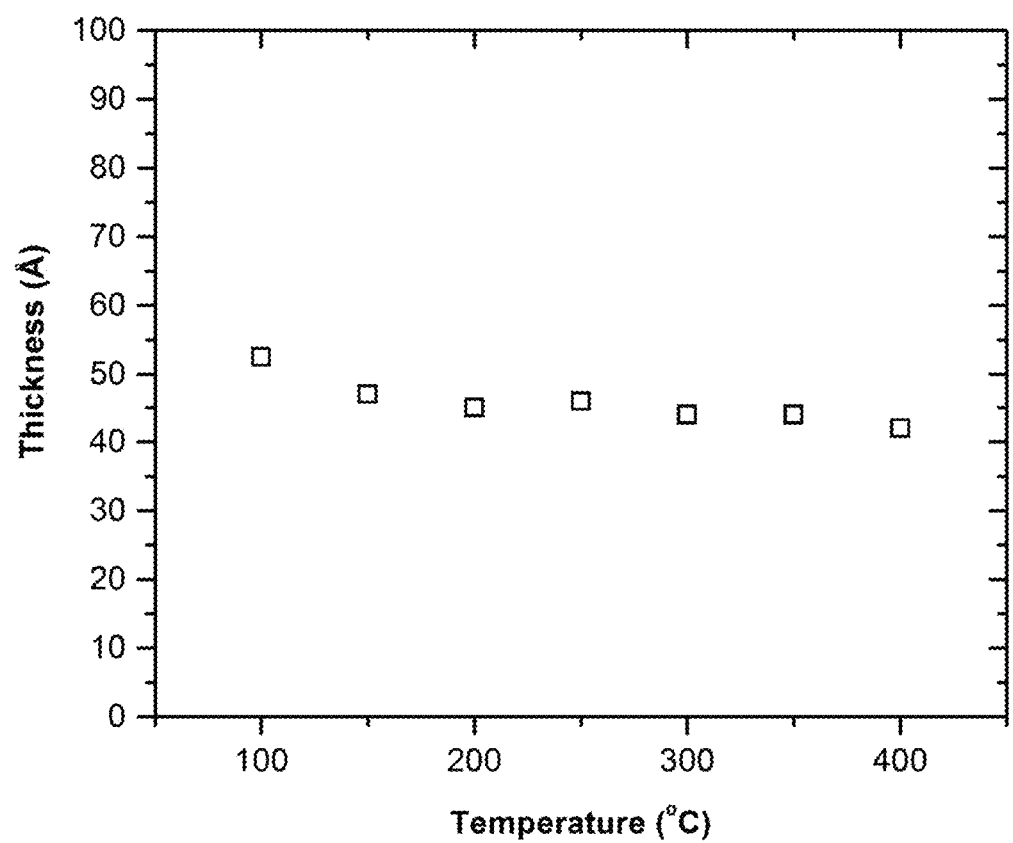
FIG. 3 provides boron nitride thickness vs substrate temperatures using DSBAB as boron precursor and nitrogen plasma as nitrogen-containing source as described in Example 1, demonstrating DSBAB is suitable for use in ALD processes.

Example 1. PEALD Boron Nitride Film Using Di-sec-butylaminoborane (DSBAB) and Nitrogen Plasma The silicon wafer was loaded into the CN-1 reactor equipped with showerhead design with 13.56 MHz direct plasma and heated to 300° C. with chamber pressure of 2 torr. Di-sec-butylaminoborane (DSBAB) as boron precursor was delivered to the reaction chamber using the vapor draw method. The ALD cycle was comprised of the following process steps:
   a. Prepare the reactor and load wafer
   Chamber pressure: 2 torr
   b. Introduce the boron-containing precursors precursor to the reactor
   Total flow $N_2$ flow: 1000 sccm
   DSBAB pulse: from 0.5 to 1.5 seconds
   c. Purge
   Total flow of $N_2$:1000 sccm
   Purge time: 10 seconds
   d. Introduce plasma
   Total flow $N_2$ flow: 1000 sccm
   Plasma power: 125 W
   Plasma pulse: 20 second
   e. Purge
   Total flow of $N_2$: 1000 sccm
   Purge time: 10 seconds Steps b to e were repeated for 200 cycles with DSBAB pulses at 0.5 s, 1.0 s, and 1.5 s respectively for boron precursor saturation tests as shown in FIG. 1 which demonstrates DSBAB reaches ALD self-limiting at about 1 second. FIG. 2 shows steps b to e were repeated for 200 cycles with various $N_2$ pulses, confirming $N_2$ plasma reaches ALD self-limiting at about 10 seconds. In other experiments, steps b to e were repeated for 100 cycles, 200 cycles, and 500 cycles respectively. The growth rate for born nitride was calculated from graph of thickness vs number of cycles as 0.14 Å/cycle, demonstrating DSBAB has higher growth rate than TDMAB described in comparable example 1. In another set of experiments, step b to e were repeated 200 cycles with the conditions DSBAB/purge/$N_2$ plasma/purge=1 s/10 s/20 s*/10 s at temperatures ranging from 100 to 400° C. Referring now to FIG. 3, FIG. 3 shows the boron nitride deposited from DSBAB and $N_2$ plasma at various substrate temperatures, suggesting DSBAB is suitable for use in ALD deposition processes (e.g., ALD processes conducted between about 150 to about 350° C.

Example 2. PEALD Boron Doped Silicon Nitride Film Using Di-sec-butylaminoborane (DSBAB), Di-iso-propylaminosilane (DIPAS), and Nitrogen Plasma The silicon wafer was loaded into the CN-1 reactor equipped with showerhead design with 13.56 MHz direct plasma and heated to 300° C. with chamber pressure of 2 torr. Di-sec-butylaminoborane (DSBAB) as boron precursor and di-iso-propylaminosilane (DIPAS) as organoaminosilane precursor were delivered using vapor draw method into the reactor. The ALD cycle was comprised of the following process parameters.
   a. Prepare the reactor and load wafer
   Chamber pressure: 2 torr
   b. Introduce the boron-containing precursor to the reactor
   Total flow $N_2$ flow: 1000 sccm
   DSBAB pulse: 0.5 second
   c. Purge
   Total flow of $N_2$: 1000 sccm
   Purge time: 10 seconds
   d. Introduce plasma
   Total flow $N_2$ flow: 1000 sccm
   Plasma power: 125 W
   Plasma pulse: 20 second
   e. Purge
   Total flow of $N_2$ 1000 sccm
   Purge time: 10 seconds
   f. Introduce an organoaminosilane precursor to the reactor
   Total flow $N_2$ flow: 1000 sccm
   DIPAS pulse: 1 second
   g. Purge
   Total flow of $N_2$ 1000 sccm
   Purge time: 10 seconds
   h. Introduce plasma
   Total flow $N_2$ flow: 1000 sccm
   Plasma power: 125 W
   Plasma pulse: 10 second
   i. Purge
   Total flow of $N_2$ 1000 sccm
   Purge time: 10 seconds In this example, one super cycle consisting of boron nitride having steps b to e are repeated once, followed by silicon nitride having steps f to i for 5 times (i.e. a super cycle=boron nitride: (DSBAB/purge/plasma/purge=0.5 s/10 s/20*/10 s)×1 cycle+silicon nitride: (DIPAS/purge/plasma/purge=1.0 s/10 s/10*s/10 s)×5 cycles)). The super cycle is repeated 200 times (i.e. (boron nitride: (DSBAB/purge/plasma/purge=0.5 s/10 s/20*s/10 s)×1 cycle)+silicon nitride: (DIPAS/purge/plasma/purge=1.0 s/10 s/10*s/10 s)×5)×200 cycles. Transmission Electron Microsopy (TEM) measurement showed the following thicknesses: boron doped silicon nitride of 155 Å. Secondary ion mass spectrometry (SIMS) analysis of the resulting film shows the following composition: B=5.99 at %, Si=33.0 at %, N=46.83 at %, O=2.35 at %, C=1.89 at %, H=9.94 at %. In another experiment, one super cycle consisting of boron nitride having steps b to e are repeated twice, followed by silicon nitride having steps f to i for 5 times (i.e. a super cycle=boron nitride: (DSBAB/purge/plasma/purge=0.5 s/10 s/20*s/10 s)×2 cycle+silicon nitride: (DIPAS/purge/plasma/purge=1.0 s/10 s/10*s/10 s)×5 cycles)). The super cycle is repeated 200 times (i.e. (boron nitride: (DSBAB/purge/plasma/purge=0.5 s/10 s/20*s/10 s)×2 cycle)+silicon nitride: (DIPAS/purge/plasma/purge=1.0 s/10 s/10*s/10 s)×5)×200 cycles. TEM measurement showed the film thickness of 170 A. Secondary ion mass spectrometry (SIMS) analysis of the resulting film shows the following composition: B=12.86 at %, Si=26.42 at %, N=44.28 at %, O=1.42 at %, C=4.36 at %, H=10.68 at %. In another experiment, one super cycle consisting of boron nitride having steps b to e are repeated one, followed by silicon nitride having steps f to i for 10 times (i.e. a super cycle=boron nitride: (DSBAB/purge/plasma/purge=0.5 s/10 s/20*/10 s)×1 cycle+silicon nitride: (DIPAS/purge/plasma/purge=1.0 s/10 s/10*s/10 s)×10 cycles)). The super cycle is repeated 100 times (i.e. (boron nitride: (DSBAB/purge/plasma/purge=0.5 s/10 s/20*s/10 s)×1 cycle)+silicon nitride: (DIPAS/purge/plasma/purge=1.0 s/10 s/10*s/10 s)×10 cycles)×100 cycles. TEM measurement showed the film thickness of 150 A. Secondary ion mass spectrometry (SIMS) analysis of the resulting film shows the following composition: B=4.63 at %, Si=35.72 at %, N=48.89 at %, O=2.27 at %, C=1.82 at %, H=6.67 at %.

Figure 4:
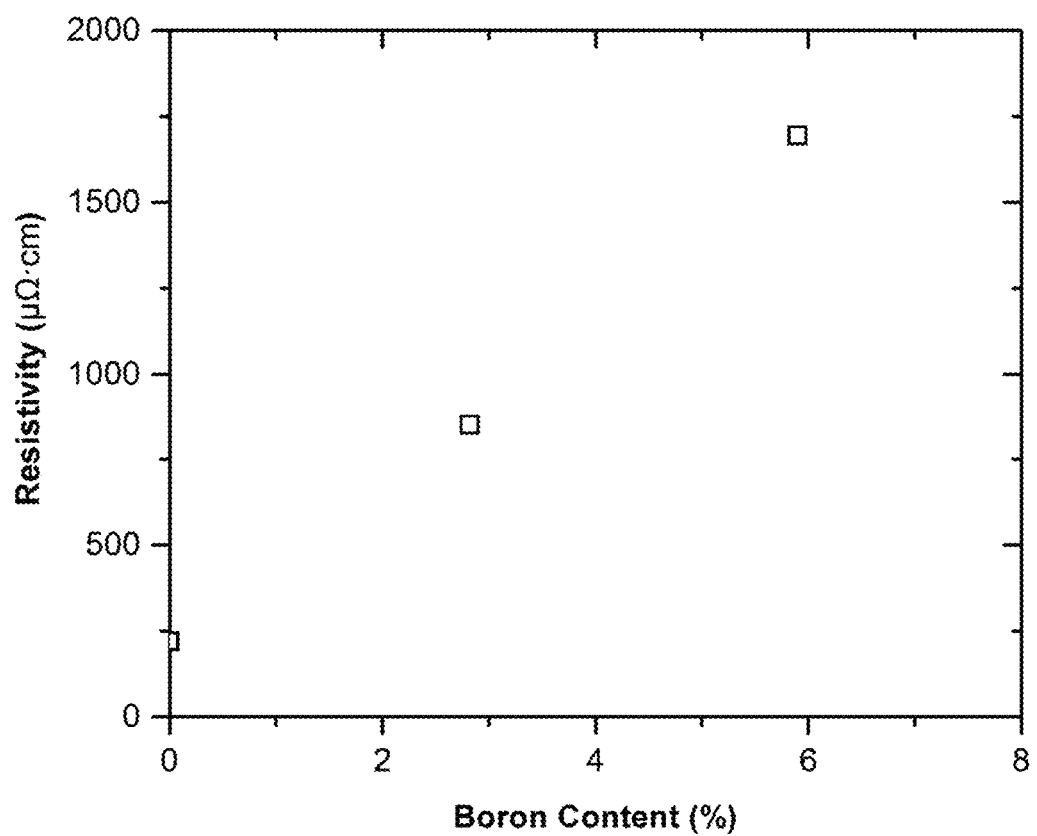
FIG. 4 provides resistivities of boron doped titanium nitride deposited from di-sec-butylaminoborane (DSBAB), tetrakis(dimethylamino)titanium (TDMAT), and nitrogen plasma as nitrogen-containing source as described in Example 3.
Figure 5:
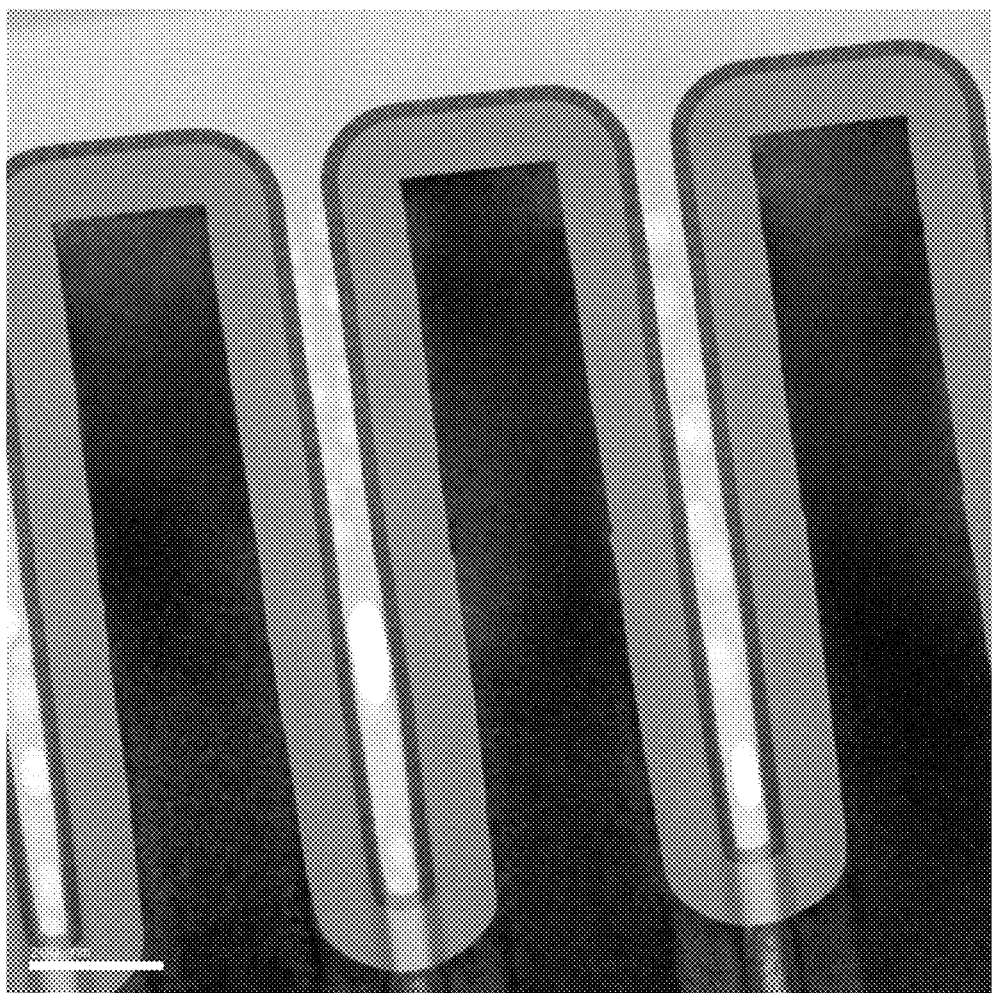
FIG. 5 provides a transmission electron microscope (TEM) image of boron doped titanium nitride nitride deposited from di-sec-butylaminoborane (DSBAB), tetrakis(dimethylamino)titanium (TDMAT), and nitrogen plasma as nitrogen-containing source as described in Example 3, which shows excellent step coverage, 100% from top to middle and bottom.

Example 3. PEALD Boron Doped Titanium Nitride Film Using Di-sec-butylaminoborane (DSBAB), Tetrakis(dimethylamino)titanium (TDMAT), and Nitrogen Plasma The silicon wafer was loaded into the CN-1 reactor equipped with showerhead design with 13.56 MHz direct plasma and heated to 300° C. with chamber pressure of 2 torr. Di-sec-butylaminoborane (DSBAB) as boron precursor using vapor draw and tetrakis(dimethylamino)titanium (TDMAT) as metal-containing precursor using bubbling (Ar flow rate was 50 sccm) were delivered into the reactor. The ALD cycle was comprised of the following process parameters.

a. Prepare the reactor and load wafer
Chamber pressure: 2 torr
b. Introduce the born-containing precursor to the reactor
Total flow $N_2$ flow: 1000 sccm
DSBAB pulse: 1 second
c. Purge
Total flow of $N_2$: 1000 sccm
Purge time: 10 seconds
d. Introduce plasma
Total flow $N_2$ flow: 1000 sccm
Plasma power: 125 W
Plasma pulse: 20 second
e. Purge
Total flow of $N_2$ 1000 sccm
Purge time: 10 seconds
f. Introduce the metal-containing precursor to the reactor
Total flow $N_2$ flow: 1000 sccm
TDMAT pulse: 1 second
g. Purge
Total flow of $N_2$ 1000 sccm
Purge time: 20 seconds
h. Introduce plasma
Total flow $N_2$ flow: 1000 sccm
Plasma power: 125 W
Plasma pulse: 5 second
i. Purge
Total flow of $N_2$ 1000 sccm
Purge time: 10 seconds In this example, one super cycle consisting of boron nitride having steps b to e are repeated once, followed by titanium nitride having steps f to i for 5 times (i.e. a super cycle=boron nitride: (DSBAB/purge/plasma/purge=1 s/10 s/20*s/10 s)×1 cycle+titanium nitride: (TDMAT/purge/plasma/purge=1.0 s/20 s/10*s/10 s)×5 cycles)). The super cycle is repeated 50 times (i.e. boron nitride: (DSBAB/purge/plasma/purge=1 s/10 s/20*s/10 s)×1 cycle+titanium nitride: (TDMAT/purge/plasma/purge=1.0 s/20 s/10* s/10 s)×5 cycles)×50 cycles. TEM measurement showed the following thicknesses: boron doped titanium nitride of 230 Å. Secondary ion mass spectrometry (SIMS) analysis of the resulting film shows the following composition: B=2.82 at %, Ti=41.02 at %, N=47.73 at %, O=2.61 at %, C=3.62 at %, H=2.48 at %. In another experiment, one super cycle consisting of boron nitride having steps b to e are repeated twice, followed by silicon nitride having steps f to i for 5 times (i.e. a super cycle=boron nitride: (DSBAB/purge/plasma/purge=1 s/10 s/20*s/10 s)×2 cycle+titanium nitride: (TDMAT/purge/plasma/purge=1.0 s/20 s/10*s/10 s)×5 cycles)). The super cycle is repeated 50 times (i.e. boron nitride: (DSBAB/purge/plasma/purge=1 s/10 s/20*s/10 s)×2 cycle+titanium nitride: (TDMAT/purge/plasma/purge=1.0 s/20 s/10*s/10 s)×5 cycles)×50 cycles. TEM measurement showed the following thicknesses: boron doped silicon nitride of 220 Å. Secondary ion mass spectrometry (SIMS) analysis of the resulting film shows the following composition: B=5.90 at %, Ti=37.58 at %, N=46.95 at %, O=1.85 at %, C=4.12 at %, H=3.59 at %. FIG. 4 shows the resistivities of deposited boron doped titanium nitride vs boron contents, demonstrating the films properties can be tuned via varying deposition parameters. For testing conformality or step coverage, pattern wafer pieces having AR=12:1 (width=95 nm, depth=1160 nm) were employed. In this experiment, one super cycle consisting of boron nitride having steps b to e are repeated twice, followed by silicon nitride having steps f to i for 5 times (i.e. a super cycle=boron nitride: (DSBAB/purge/plasma/purge=1 s/10 s/20*s/10 s)×2 cycle+titanium nitride: (TDMAT/purge/plasma/purge=1.0 s/20 s/10*s/10 s)×5 cycles)). The super cycle is repeated 50 times (i.e. boron nitride: (DSBAB/purge/plasma/purge=1 s/10 s/20*s/10 s)×2 cycle+titanium nitride: (TDMAT/purge/plasma/purge=1.0 s/20 s/10* s/10 s)×5 cycles)×50 cycles: (DIPAS/purge/plasma/purge=1.0 s/10 s/10*s/10 s for 10 cycles)×50 cycles). TEM measurement (FIG. 5) showed the following thicknesses: top, 220 Å, middle, 220 Å, and bottom, 220 Å which corresponding to 100% conformality or step coverage.

While the invention has been described with reference to certain aspects or embodiments, it will be understood by those skilled in the art that various changes may be made and equivalents may be substituted for elements thereof without departing from the scope of the invention. In addition, many modifications may be made to adapt the teachings of the invention without departing from the essential scope thereof. Therefore, it is intended that the invention not be limited to the particular embodiment disclosed as the best mode contemplated for carrying out this invention, but that the invention will include all embodiments falling within the scope of the appended claims.

The invention claimed is:

1. A method to deposit a boron-containing film onto at least a surface of a substrate which comprises the steps of:
providing the substrate in a reactor; and
forming the boron-containing film on a surface of the substrate in a deposition process selected from a group consisting of a chemical vapor deposition, an atomic layer deposition-like deposition, and an atomic layer deposition process, wherein the deposition process is conducted at one or more temperatures from room temperature to about 400° C. and repeated until a desired thickness of the boron-containing film is obtained and includes a boron-containing precursor selected from at least one compound having the following formula I and II:

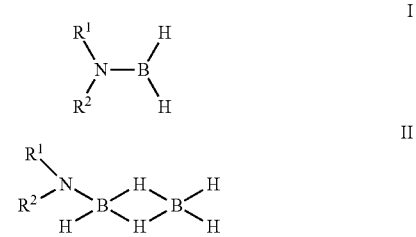

wherein R1 is selected from a linear $C_1$ to $C_{10}$ alkyl group, a branched $C_3$ to $C_{10}$ alkyl group, a linear or branched $C_3$ to $C_{10}$ alkenyl group, a linear or branched $C_3$ to $C_{10}$ alkynyl group, a $C_1$ to $C_6$ dialkylamino group, an electron withdrawing group, and a $C_4$ to $C_{10}$ aryl group; $R^2$ is selected from hydrogen, a linear $C_1$ to $C_{10}$ alkyl group, a branched $C_3$ to $C_{10}$ alkyl group, a linear or branched $C_3$ to $C_6$ alkenyl group, a linear or branched $C_3$ to $C_6$ alkynyl group, a $C_1$ to $C_6$ dialkylamino group, a $C_6$ to $C_{10}$ aryl group, a linear or branched $C_1$ to $C_6$ fluorinated alkyl group, and a $C_4$ to $C_{10}$ aryl group; and optionally wherein $R^1$ and $R^2$ are linked together to form a ring selected from a substituted or unsubstituted aromatic ring or a substituted or unsubstituted aliphatic ring;
wherein the amount of boron in the boron containing film is 8% or less.

2. The method of claim 1 wherein the boron-containing precursor comprises a compound having formula I.

3. The method of claim 1 wherein the boron-containing precursor comprises at least one member selected from the group consisting of dimethylaminoborane, diethylaminoborane, ethylmethylaminoborane, di-iso-propylaminoborane, di-sec-butylaminoborane, N-ethyl-cyclohexylaminoborane, N-methyl-cyclohexylaminoborane, N-iso-propyl-cyclohexyaminoborane, phenylmethylaminoborane, phenylethylaminoborane, piperidinoborane, 2,6-dimethylpiperidinoborane, di-iso-propylaminodiborane, di-sec-butylaminodiborane, 2,6-dimethylpiperidinodiborane, and 2,2,6,6-tetramethylpiperidinoborane.

4. The method of claim 1 wherein the boron-containing precursor comprises a compound having formula II.

5. The method of claim 1 wherein the precursor further comprises at least one solvent.

6. A boron-containing film produced in accordance with claim 1.

7. The method of claim 5 wherein the solvent comprises at least one member selected from the group consisting of ether, tertiary amine, alkyl hydrocarbon, aromatic hydrocarbon, tertiary aminoether.

\* \* \* \* \*